(12) United States Patent
Saksager

(10) Patent No.: US 11,880,246 B2
(45) Date of Patent: Jan. 23, 2024

(54) COOLING SYSTEM INCLUDING A HEAT EXCHANGING UNIT

(71) Applicant: Asetek Danmark A/S, Aalborg Øst (DK)

(72) Inventor: Anders Hjørringgaard Saksager, Svenstrup J (DK)

(73) Assignee: Asetek Danmark A/S, Aalborg Øst (DK)

( * ) Notice: Subject to any disclaimer, the term of this patent is extended or adjusted under 35 U.S.C. 154(b) by 389 days.

(21) Appl. No.: 17/425,632

(22) PCT Filed: Jan. 23, 2020

(86) PCT No.: PCT/EP2020/051604
§ 371 (c)(1),
(2) Date: Jul. 23, 2021

(87) PCT Pub. No.: WO2020/152258
PCT Pub. Date: Jul. 30, 2020

(65) Prior Publication Data
US 2022/0100242 A1 Mar. 31, 2022

(30) Foreign Application Priority Data
Jan. 25, 2019 (EP) ..................... 19153712

(51) Int. Cl.
*G06F 1/20* (2006.01)
(52) U.S. Cl.
CPC ...... *G06F 1/20* (2013.01); *G05B 2219/49216* (2013.01)
(58) Field of Classification Search
CPC ............... H05K 7/205; H05K 7/20509; H05K 7/20718; G06F 1/20
See application file for complete search history.

(56) References Cited

U.S. PATENT DOCUMENTS 1,524,520 A * 1/1925 Junkers .................. F28D 7/085
62/526
5,228,198 A * 7/1993 Paulman .............. B21D 53/085
29/890.044

(Continued)

OTHER PUBLICATIONS

International Preliminary Report on Patentability for International Application No. PCT/EP2020/051604, dated Apr. 22, 2021 (8 pages).

*Primary Examiner* — Adrian S Wilson
(74) *Attorney, Agent, or Firm* — Finnegan, Henderson, Farabow, Garrett & Dunner LLP

(57) ABSTRACT

With increased demand for compact computing and easy to install computer components, there is an increased demand for user-friendly cooling solutions. Therefore, there is provided a cooling unit (100) for cooling liquid in a liquid-cooled computer system (10), wherein the cooling unit (100) comprises: an airflow unit (110) for generating an airflow in a first direction (170) along an airflow path, a radiator unit (130) having a liquid inlet (126) for receiving an inflow of a cooling liquid, a liquid outlet (127) for releasing an outflow of cooling liquid, an inner liquid path (171) for conducting liquid between said liquid inlet (126) and said liquid outlet (127), an array of at least two radiator bridges (131, 132), each having a plurality of parallel channels (160), said radiator bridges (131, 132) traversing said airflow path and being spaced apart along said first direction (170), said radiator bridges (131, 132) further being thermally separated from one another by gaps (141), where a first radiator bridge (131) from among said array of at least two radiator bridges (131, 132) is arranged to receive liquid from said liquid inlet (126, 127) to pass through its channels (160), said first radiator bridge (131) being the radiator bridge that is the farthest from said airflow unit (110), where said inner liquid path (171) is conducted from said liquid (Continued)

inlet (126), sequentially via said radiator bridges (131, 132) by order of proximity to said first radiator bridge (131), and to said liquid outlet (127), whereby a flow of air generated by said airflow unit (110) passes through said radiator bridges (131, 132) to exchange heat between said flow of air and said radiator unit (130). Thereby, a cooling unit is provided that provides efficient cooling while fitting into hitherto inconvenient form factors.

20 Claims, 7 Drawing Sheets

(56) References Cited

U.S. PATENT DOCUMENTS

| | | | | |
|---|---|---|---|---|
| 5,540,276 A * | 7/1996 | Adams | F28F 1/32 | 165/150 |
| 5,582,244 A * | 12/1996 | Helms | F28F 1/325 | 165/182 |
| 5,799,725 A * | 9/1998 | Bradley, Jr. | F28F 9/262 | 165/182 |
| 5,881,567 A * | 3/1999 | Junge | F25D 23/003 | 62/428 |
| 6,166,907 A * | 12/2000 | Chien | F28D 1/0478 | 361/689 |
| 6,253,839 B1 * | 7/2001 | Reagen | B21D 53/085 | 165/182 |
| 6,377,453 B1 * | 4/2002 | Belady | H05K 7/2039 | 174/16.3 |
| 6,536,516 B2 * | 3/2003 | Davies | F28D 1/0308 | 165/170 |
| 6,598,295 B1 * | 7/2003 | Utter | B21D 53/085 | 29/890.047 |
| 6,793,010 B1 * | 9/2004 | Manole | F28F 1/32 | 62/526 |
| 6,997,247 B2 | 2/2006 | Malone et al. | | |
| 7,004,241 B2 * | 2/2006 | Smithey | F28D 1/0477 | 29/890.047 |
| 7,028,764 B2 * | 4/2006 | Reagen | F25B 39/02 | 62/515 |
| 7,065,982 B2 * | 6/2006 | Schmid | F28F 1/32 | 62/515 |
| 7,073,574 B2 * | 7/2006 | Smithey | F28F 1/32 | 165/151 |
| 7,165,326 B2 * | 1/2007 | Kurihara | F28F 1/32 | 29/890.047 |
| 7,710,722 B2 * | 5/2010 | Suzuki | G06F 1/203 | 165/181 |
| 8,917,503 B2 * | 12/2014 | Chen | F28F 13/12 | 174/548 |
| 8,934,242 B2 * | 1/2015 | Bean, Jr. | H05K 7/20745 | 361/679.48 |
| 9,255,746 B2 * | 2/2016 | Valensa | B01J 8/02 | |
| 10,274,192 B2 * | 4/2019 | Truong | F22D 5/34 | |
| 10,801,782 B2 * | 10/2020 | Petersen | F28D 1/0443 | |
| 11,022,382 B2 * | 6/2021 | Cao | F28D 1/0426 | |
| 11,025,034 B2 * | 6/2021 | Hodges | F28F 3/12 | |
| 2002/0117291 A1 * | 8/2002 | Cheon | G06F 1/20 | 165/80.4 |
| 2004/0194935 A1 * | 10/2004 | Cho | F28D 1/0478 | 165/149 |
| 2005/0061492 A1 * | 3/2005 | Kurihara | F28F 1/42 | 165/150 |
| 2005/0230083 A1 | 10/2005 | Hsieh | | |
| 2006/0108105 A1 | 5/2006 | Huang et al. | | |
| 2009/0001560 A1 | 1/2009 | Stefanoski | | |
| 2011/0056668 A1 | 3/2011 | Taras et al. | | |
| 2017/0255211 A1 | 9/2017 | Haigh | | |

* cited by examiner

COOLING SYSTEM INCLUDING A HEAT EXCHANGING UNIT

FIELD OF THE INVENTION

Background of the Invention

During the operation of a computer, heat is generated by the components of the system, such as by the Central Processing Unit (CPU) and the graphics card.

Given the need for computers that can process an increasing amount of data, such as in the gaming industry, the amount of heat generated and therefore the required cooling effect also increases. This pressure is combined with a pressure for decreased size of computer systems. These combined pressures produce a demand for efficient cooling systems that fit in a variety of computer assembly situations. Thus, new cooling systems are required that can be adaptably located in the computer system depending on user needs.

Air cooling systems have been favourites among small form factor computer assemblers for their shape variety, where even small systems can get a heat sink and fans that fit their builds.

Conventional water cooling systems are used in small form factor computers by water cooling enthusiasts. However, this often offsets the benefits of a small form factor computer solution, as external cooling loops become necessary due to a lack of space for these solutions.

Air-cooling solutions do not fare much better however. They are unable to dissipate the heat generated by processing units sufficiently quickly in an effective manner.

This means that the user must choose between reduced parts lifespan and thermal throttling at high parts temperature, whirring noise of overworked fans, further reduced computing power by under-volting/under-clocking computing units, or, if using water cooling, external parts that run counter to the desires of the user for a small computer in the first place.

SUMMARY OF THE INVENTION

It is the aim of the current invention to alleviate at least some of the above-mentioned problems. This is achieved by a cooling unit for cooling liquid in a liquid-cooled computer system, wherein the cooling unit comprises an airflow unit for generating an airflow in said first direction and a radiator unit. The radiator unit has a liquid inlet for receiving an inflow of a cooling liquid, a liquid outlet for releasing an outflow of cooling liquid, an inner liquid path for conducting liquid between said liquid inlet and said liquid outlet, a compartment having an air ingress end and an air exhaust end, the ends being placed opposite each other along said first direction, the ingress end being arranged adjacent to said airflow unit whereby said generated airflow is passed into said compartment through said ingress end, two or more radiator bridges having a plurality of parallel channels, said radiator bridges traversing said compartment and being spaced apart along said first direction, further being thermally separated from one another in said compartment by gaps, where said inner liquid path is conducted from said liquid inlet, sequentially via said radiator bridges by order of proximity to said exhaust opening, and then to said liquid outlet, whereby a flow of air generated by said airflow unit passes into said compartment and between said channels of said radiator bridges, to exchange heat between said flow of air and said radiator unit.

Thereby, the path of the cooling liquid is made long as it passes in a serpentine path pattern through the cooling unit, nearing the airflow unit with each successive pass through a radiator bridge. The temperature of the air nears ambient and cools the radiator and the air inside it progressively in steps. Improved cooling efficiency is achieved since a stepwise pseudo-counterflow structure is used, all the while retaining an adaptable radiator shape that can for example be very narrow and thus fit into a personal computer more easily. Furthermore, constructing radiators and passing liquid through them in turn has several manufacture-related advantages over a more complicated true counterflow structure.

The radiator bridges are connected to each other in turn, such as by simple channel connectors connecting the ends of each channel with its counterpart of neighbouring radiator bridges.

In an embodiment, radiator bridges are connected to provide the inner liquid path at their ends through redistributing manifolds that combine and redistribute the cooling liquid among the channels of neighbouring radiator bridges. Thereby, temperature discrepancies in the liquid may be evened out. Furthermore, a construction using redistributing manifolds may be easier to manufacture.

In one embodiment, a partial compartment is used through which the radiator bridges traverse to traverse the airflow. This compartment has sides for keeping the airflow moving through all the radiator bridges as well as for having the manifolds or channel connectors. The compartment may have a closed or open top and a closed or open bottom. In another embodiment, a true compartment is used well having of course open ends, and further closed sides and top and bottom to facilitate maximal heat exchange.

Any conventional and fitting airflow generating unit may be used to provide the airflow needed for the cooling unit, such as a radial fan or an axial fan. Preferably a radial fan is used as the airflow unit. By using a radial fan, a low fan profile is achieved that is durable and powerful, and capable of providing and maintaining a high static pressure beneficial with the long radiator unit. Furthermore, a radial fan utilises the space available effectively.

The cooling unit for cooling liquid in a liquid-cooled computer system may be fitted to provide cooling for any part of a computer system such as a GPU, a CPU, or RAM.

In an embodiment, the parallel channels are separated from one another along a direction being perpendicular to the first direction.

The parallel channels are spaced from one another along a height dimension and the radiator unit has a length extending in the first direction being the direction in which an airflow is generated. In an embodiment, the radiator unit has a length being greater than its height. Providing a radiator unit whose length is greater than its height has the advantage that the radiator unit can take a flat shape and therefore provide efficient cooling under the sizing constraints of the computer system, e.g. in cases where the cooling system has to cool elements, which also have a flat shape, or where the space available is flat and long.

In an embodiment, the parallel channels are substantially flat and/or with oblong cross-sections. This allows better fin layer construction, better dissipative characteristics, controls the airflow better and provides less airflow obstruction than more circular or square cross-sections.

In an embodiment, the majority of radiator bridges have two or more parallel channels. In an embodiment, the majority of radiator bridges have three or more parallel channels. In an embodiment, the majority of radiator bridges have four or more parallel channels. In an embodiment, all radiator bridges have at least two, at least three or at least four parallel channels. In an embodiment, the radiator unit again has a length half as long as its height. In an embodiment, the radiator unit has a length twice that of its height. In an embodiment, the radiator unit has a length thrice that of its height. In an embodiment, the radiator unit has a length four times that of its height. Providing a radiator unit being even longer and/or flatter makes it comply with even stricter sizing constraints while providing effective cooling.

In an embodiment, the radiator unit has three or more radiator bridges. In an embodiment, the radiator unit has four or more radiator bridges. Thereby, the inner liquid path is even longer, and the heat exchange efficiency is increased. In an embodiment, the radiator unit has five or more radiator bridges. In an embodiment, the radiator unit has six or more radiator bridges. In an embodiment, the radiator unit has eight or more radiator bridges. By providing additional radiator bridges, the inner liquid path is even longer, and the heat exchange efficiency is even further increased.

For all embodiments, the inner liquid pathway is conducted through radiator bridges by order of adjacency/proximity. This means that the pathway becomes serpentine-shaped, zig-zagged or toothed belt-like. The liquid inlet conducts liquid to the radiator bridge farthest from the airflow unit. After this first radiator bridge, the inner liquid path is conducted to the radiator bridge nearest the first radiator bridge, then one nearest to this second radiator bridge, and so on, until the inner liquid path has been conducted through all radiator bridges. The inner liquid path is conducted to the radiator bridge being nearest to the airflow unit last. Then the inner liquid path is conducted to the liquid outlet.

In other words, the liquid inlet and liquid outlets are simply parts that connect the radiator unit liquidly at its liquid path ends to another part of a liquid cooling system. Such liquid cooling system may be part of an integrated cooling system, such as a rigidly constructed system or a pre-assembled system, or it may allow modular attachment and detachment of liquid tubes.

In an embodiment, the liquid inlet and the liquid outlet comprise threaded engagement means or burr engagement means or other conventional attachment means to allow attaching tubes, fittings or other conventional liquid loop components to the liquid inlet and liquid outlet in a modular manner.

In an embodiment, the liquid inlet and the liquid outlet are constructional features connecting the first and last radiator bridge to another part of the liquid loop. Such inlet and outlet may be part of an integrated liquid loop built in any fashion, such as to an integrated computing system, where the cooling unit is mounted directly to a heat-producing PCB or logic board. In this embodiment, the inlet connects the radiator bridge farthest away from the airflow unit to a liquid return channel; and the liquid outlet connects the radiator bridge nearest the airflow unit to a cooling channel.

In an embodiment, the radiator unit has an even number of radiator bridges.

Thereby, the liquid inlet and the liquid outlet are provided on the same side of the cooling unit thus avoiding conducting the liquid path sideways along the cooling unit extraneously and necessitating smaller components. Thereby, cooling unit efficiency is increased.

In an embodiment, the cooling unit further comprises an expansion card plug adapted to fit frictionally into a corresponding expansion slot on a motherboard or logic board of a computer system. In an embodiment, the cooling unit is adapted to fit into a computer as an expansion card for a personal computer motherboard, such as a card fitting into a PCI-e slot. In an embodiment, the cooling unit is adapted to fit into a computer through a PCI-e slot.

By providing the cooling unit as an expansion card, the cooling unit may be arranged to fit into one of the expansion slots of the computer system, such as at the PCI-e slots. The slots are often non-populated, for which reason sufficient space for storing a cooling unit is present in computer systems in many cases. This results in that the mounting of the cooling unit is more easily done as there is sufficient space for manoeuvring it into place, compared to if the heat exchanging unit had to be mounted at another location where a lot of components are already taking up most of the free space, or where already mounted elements have to be temporarily removed or be relocated to ensure sufficient space for the heat exchanging unit. Furthermore, affixing the cooling unit may be done almost without screws and other affixing means and relying on the frictional fit between the plug of the cooling unit and the socket on the motherboard as well preferably as a fastening screw on the bracket on the rear end of the card outside the case. Thereby, mounting is very easy, and the cooling unit is almost 'plug-and-play'.

By fitting frictionally into a predetermined space in a computer, fitting the cooling unit into the computer is easy and convenient, and the cooling unit will fit into many types of computers. If a computer has a GPU and the motherboard has two or more PCI-e sockets for example, it is possible to mount the GPU in one socket and the cooling unit in another socket.

In an embodiment, the cooling unit is adapted to have a height dimension complying with being a single-slot PCI-e card. In an embodiment, the cooling unit is adapted to have a height dimension complying with being a double-slot PCI-e card.

By complying with standard extension card sizes such as standard PCI-e card sizes, the cooling is user friendly to fit into a computer for liquid cooling the computer system.

Further, if the cooling system were to cool an element, which is also mounted at a slot bracket, such as a graphics card, then it is an advantage that the cooling system is located close to the element, so that the process of connecting the cooling system to the element is made easier and faster, and also so that the cooling liquid tubing, which connects the heat exchanging unit to the pumping unit being in contact with said element, is kept at the shortest possible length e.g. to minimise temperature changes of the cooling liquid during its passage through said tubing.

In an embodiment, the expansion card plug provides electrical connection between said cooling unit and said motherboard or logic board.

Thereby, either liquid cooling system controls are provided and/or power for the cooling unit is provided. This improves cable management in the computer, since at least one cable is obviated in the computer. Many consumers like to show off their systems, and for these people, the fewer cables present in the computer, the better. Furthermore, providing electrical connection between the cooling unit and the computer system through the expansion card interface reduces part count and material use and makes damaging or loosening of a cable less probable.

In an embodiment, the cooling unit is adapted to fit into a server cabinet rack system, where the cooling unit is adapted to take up a number of rack slots in a server cabinet and to provide cooling for a plurality of computing units. Thereby, a compact cooling unit is obtained that nevertheless achieves an effective cooling through the unique layout of the cooling unit of the invention.

In an embodiment, the cooling unit fits into a single rack slot in a server cabinet. In an embodiment, the cooling unit fits into a dual rack slot/two adjacent rack slots in the server cabinet. In an embodiment, the cooling unit fits into a triple rack slot/three adjacent rack slots in the server cabinet. In an embodiment, the cooling unit fits into four adjacent rack slots in the server cabinet. By complying with size standards of the server cabinet, an effective heat exchanger is obtained that nevertheless takes up no space external to the server cabinet in which it is inserted.

In an embodiment, a temperature sensor is provided to measure the temperature of a liquid in the inner liquid path, and where sensor data from the sensor is provided to control the speed of the airflow unit.

By controlling the power delivery to the airflow unit, the cooling unit can control its speed and hence the speed of the generated airflow and/or the pressure.

In an embodiment, the airflow unit is controlled based on a temperature sensor located in the cooling unit. In a further embodiment, the airflow unit is controlled based on a temperature sensor located in the radiator system.

It is conventional in liquid cooling systems for the pump—which already contains electronics close to the liquid system—to have a liquid temperature sensor that controls the airflow unit speed of an airflow unit cooling a radiator. However, as there is a distance between the pump and the radiator, this can miss important timings. Furthermore, it is practical to provide a sensor-control system directly in the cooling unit. This provides user-friendly precision cooling. By providing the airflow unit controls directly on the cooling unit, cabling in the PC case is eased, since the conventional control cable from the pump/processing unit can be omitted.

In an embodiment, the sensor is located at the liquid inlet. By providing the sensor at the liquid inlet, the effect of changes in computing unit temperature/workload on the liquid temperature can be sensed, and the airflow unit speed can be adjusted accordingly as the liquid enters the radiator unit.

In an embodiment, the sensor is located at the liquid outlet. By providing the sensor in the liquid outlet, the combined effect of the computing unit workload and the airflow unit workload can be assessed, and the speed airflow unit can be adjusted accordingly.

In an embodiment, a sensor is provided at both the liquid inlet and at the liquid outlet. Thereby, the liquid temperature can be adjusted accurately as it is needed. This further allows assessing the efficiency of the cooling unit over time. For example, a baseline performance can be established, where a given fan speed at a given ambient temperature has an expected outlet temperature. With excessive build-up of dust in the radiator or a leaky liquid cooling system, the cooling unit may underperform for a given fan speed, which can then be identified accurately as a deviance from the expected relationship between the power delivered to the fan and the output temperature of the liquid at the liquid outlet.

In an embodiment, the invention relates to a liquid cooling system for a processing unit such as a GPU, the liquid cooling system comprising a cooling unit according to the invention. Such a liquid cooling system further comprises a heat sink attached to the processing unit. This heat sink has a heat sink liquid inlet, a heat sink liquid outlet and a heat sink liquid path for conducting liquid between said heat sink inlet and said heat sink outlet to conduct cooling liquid for heat exchange. The liquid cooling system further has a cooling tube extending from the liquid outlet to the heat sink inlet, a return tube extending from the heat sink outlet to the liquid inlet, cooling liquid substantially filling the inner liquid path, the tubes and the liquid channel, and the system further has a pump for pumping said liquid through said liquid cooling system to move said liquid from said liquid inlet sequentially via said radiator bridges by order of proximity to said exhaust opening, and to said liquid outlet.

Thereby, a liquid cooling system is provided, in which liquid is used to cool the computing unit by using the cooling unit as intended in its pseudo-counterflow arrangement. This allows efficient cooling for computing units such as a GPU.

In an embodiment, the invention relates to an integrated computing system comprising a cooling unit according to the invention. The integrated computing system further comprises
an expansion card including an expansion card PCB and a heat-generating processing component,
a cold plate attached to said processing component with a cold plate chamber, through which to conduct liquid to effect heat exchange between said processing component and said liquid,
a cooling channel extending from said liquid outlet to said cold plate chamber and a return channel extending from said cold plate chamber to said liquid inlet, where the channels, inlet and outlet, cold plate chamber and inner liquid pathway form a liquid loop,
a liquid pump interposed in the liquid loop for pumping said liquid through said liquid loop,
where the cooling unit is mounted onto the expansion card PCB.

Thereby, compact and efficient cooling is achieved for an expansion card.

In an embodiment of the integrated computing system, the liquid pump moves the liquid in a direction from said liquid inlet, sequentially via said radiator bridges by order of proximity to said first radiator bridge and to said liquid outlet. Thereby, a counterflow heat exchanger is achieved.

In an embodiment of the integrated computing system, the airflow unit has an upper airflow inlet and a lower airflow inlet. One of the airflow inlets receives air from an airflow inlet channel adjacent to the expansion card PCB, and the airflow inlet channel is constructed to provide air cooling to heat-producing electronical units on the expansion card PCB. Expansion cards tend towards greater and greater heat production, and while the central processing chip, such as the GPU processing chip, produces the most heat, other components also produce significant of heat. By constructing an airflow inlet channel designed to cool specific heat-producing electronical units on the expansion card PCB, granular and precise cooling can be achieved.

In an embodiment, the airflow inlet channel opening is located at the rear end of the card, distal to the airflow unit. In an embodiment, the airflow inlet channel is located on a lateral side. In an embodiment, a plurality of airflow inlet channels is provided.

LIST OF THE DRAWINGS

In the following, example embodiments are described according to the invention, where:

FIG. 1 is a schematic illustration of a cooling unit according to the invention, FIG. 2 is an axonometric view of a cooling device according to the invention, FIG. 3 is a cross-sectional top view of a cooling device according to the invention, FIG. 4 is a cross-sectional side view of a cooling device according to the invention, FIG. 5 is a parallel-projected side view of a PC with a cooling device according to the invention, FIGS. 6A-C are cross-sectional front-views of various embodiments of a cooling device according to the invention, FIGS. 7A and 7B are cross-sectional top views of an integrated computing system according to the invention, FIG. 7C is a cross-sectional side view of an integrated computing system according to the invention, and FIG. 8 is a cross-sectional side view of an embodiment of an integrated computing system according to the invention.

DESCRIPTION OF DRAWINGS

In the following, the invention is described in detail through embodiments thereof that should not be thought of as limiting to the scope of the invention.

Figure 1:
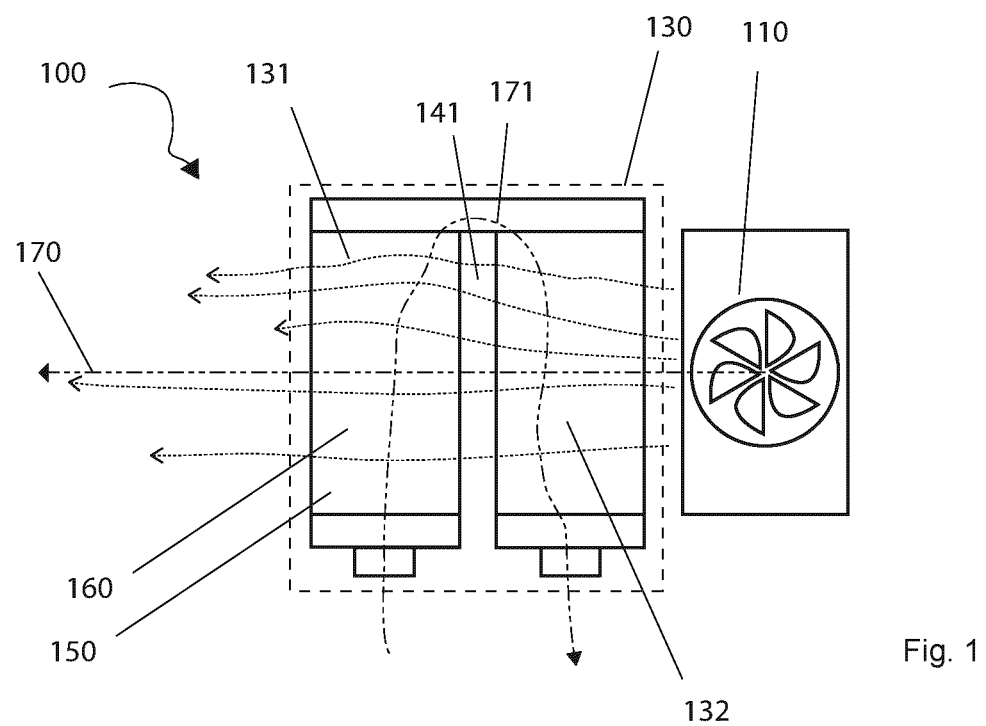
FIG. 1 is a schematic illustration of an embodiment of a cooling unit 100 according to the invention. The cooling unit 100 has an airflow unit 110 and a radiator unit 130.

The airflow unit is adapted to provide an airflow through/over the radiator unit 130 along a first direction 170.

The radiator unit 130 has a liquid inlet 126 and a liquid outlet 127 for interfacing with liquid tubes of a liquid cooling system. These are conveniently provided to ensure easy fitting with tubing sizes conventionally used in liquid cooling for computer systems.

The radiator unit 130 further has two radiator bridges 131, 132 thermally separated by a gap 141. These individual radiator bridges 131, 132 are what may normally simply be called radiators and may be structurally similar to conventional liquid cooling radiators. They bridge through the airflow generated by the airflow unit 110 from one side to the opposite side. An inner liquid path 171 is provided in the radiator unit 130 that passes through the radiator bridges 131, 132 in sequence. The sequence is that the inner liquid path passes through the first radiator bridge 131 first and then the nearest radiator bridge approaching the airflow unit 110.

This allows the temperature of the first radiator bridge 131 to be different than the temperature of the second radiator bridge 132. Because the cooling unit 100 conducts an inner liquid path 171 in a serpentine pattern over the airflow path towards the airflow unit 110, a stepwise cooling of a liquid inside is achieved. This achieves some of the benefits of a counter-flow radiator design while being easier to manufacture and fitting into convenient form factors more easily.

Each radiator bridge 131, 132 comprises at least two parallel channels 160 (of which only one is illustrated per radiator bridge in FIG. 1) separated from one another along a direction being angled to the first direction 170, preferably substantially perpendicular to the first direction.

Preferably, a dividing manifold is provided to separate the liquid efficiently from the liquid inlet 126 among the channels 160 of the first radiator bridge 131, while a combining manifold is preferably provided to combine the flows efficiently before providing them to the liquid outlet 127. Between the radiator bridges 131, 132, the liquid flows are redistributed from one bridge to the next in turn by proximity.

Preferably, the liquid flows are recombined from channels of the previous radiator bridge and redistributed among channels of the next radiator bridge using a redistributing manifold. This may serve to decrease liquid flow resistance, decrease temperature discrepancies in the liquid, provide a radiator wall, so the airflow does not escape, as well as be easy to manufacture. It is also possible to conduct the liquid flows continually through parallel long s-shaped channels throughout the radiator unit 130 without redistributing among individual channels 160.

As will be described in relation to other figures, more radiator bridges can be provided to increase the effective inner liquid path 171 length. Four, six and eight are preferable numbers of radiator bridges for various use situations.

Figure 2:
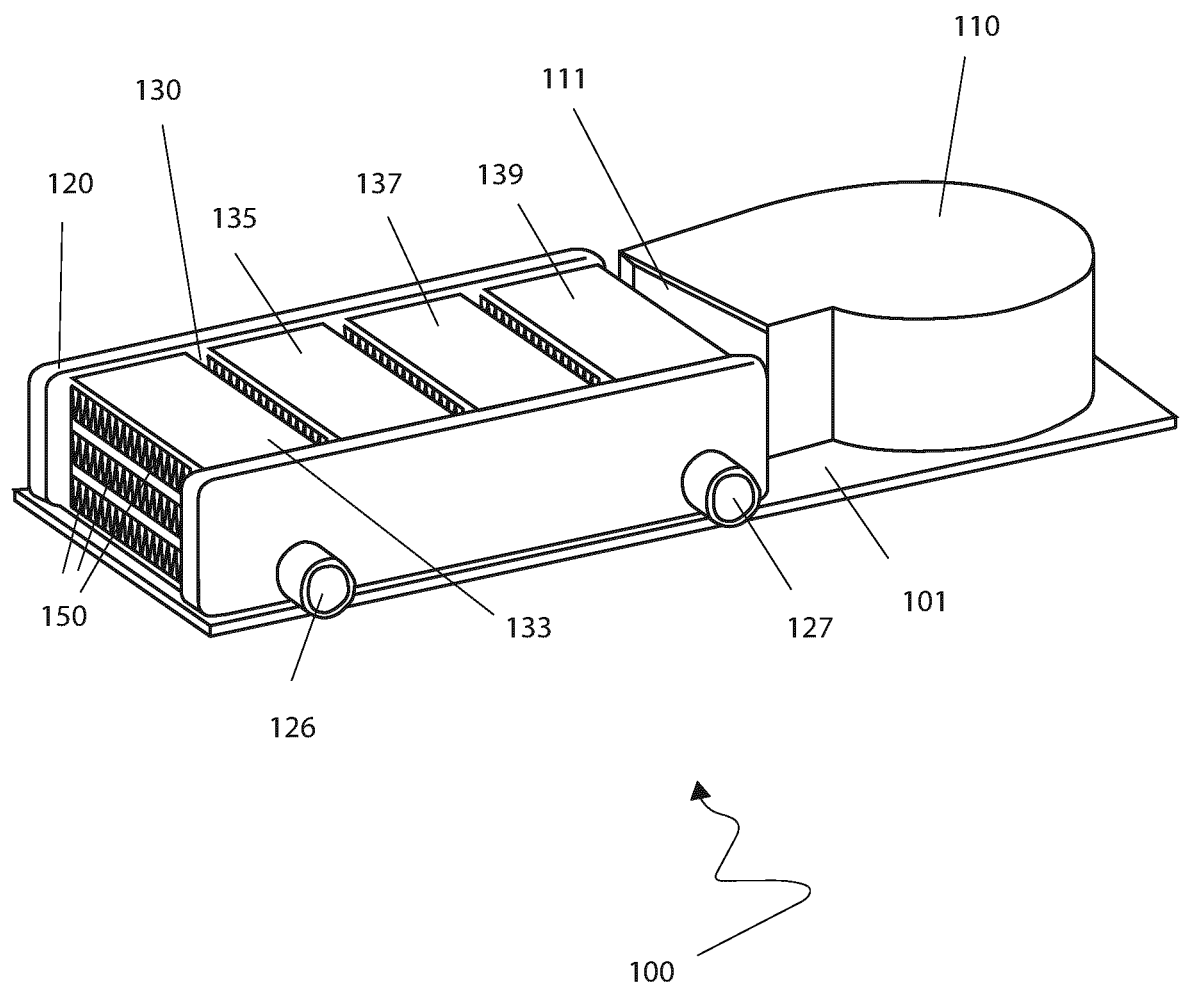

FIG. 2 is an axonometric view of a cooling device 100 according to the invention. The cooling device has a radiator unit 130 and an airflow unit 110 blowing ambient air out of a fan opening 111 over/through the radiator unit 130. The radiator unit 130 has an array of radiator bridges 133, 135, 137, 139 as well as side panels 120. The side panels 120 keep the air current produced by the airflow unit 110 moving through all four of the radiator bridges. The side panels 120 have manifolds which will be described further down. Each radiator bridge has a number of channels 160 for transporting water and fin layers 150 sandwiched in between. Air from the airflow unit 110 passes through the fin layers 150 absorbing the heat dissipated to the fin layers 150 as well as from the channels 160 themselves.

In between each pair of adjacent radiator bridges, an insulating gap ensures significant thermal insulation. The insulating gap is conveniently simply air, or in other words, a lack of thermally conductive radiator material. The cooling device 100 is mounted on a PCI-e sized plate or a PCB 101 that has an elongate plug for affixing in a PCI-e slot. The protrusions may connect electrically to the PCI-e slot or simply have a fitting thickness to ensure it can be fastened reversibly through friction in the PCI-e slot.

Liquid is moved into the cooling unit 100 through the liquid inlet 126, from where it moves through the inner liquid path through the first radiator bridge 133, then the second radiator bridge 135, the third radiator bridge 137, the fourth radiator bridge 139 and out of the liquid outlet 127. This ensures that the liquid is cooled increasingly as it nears the airflow unit 110.

Figure 3:
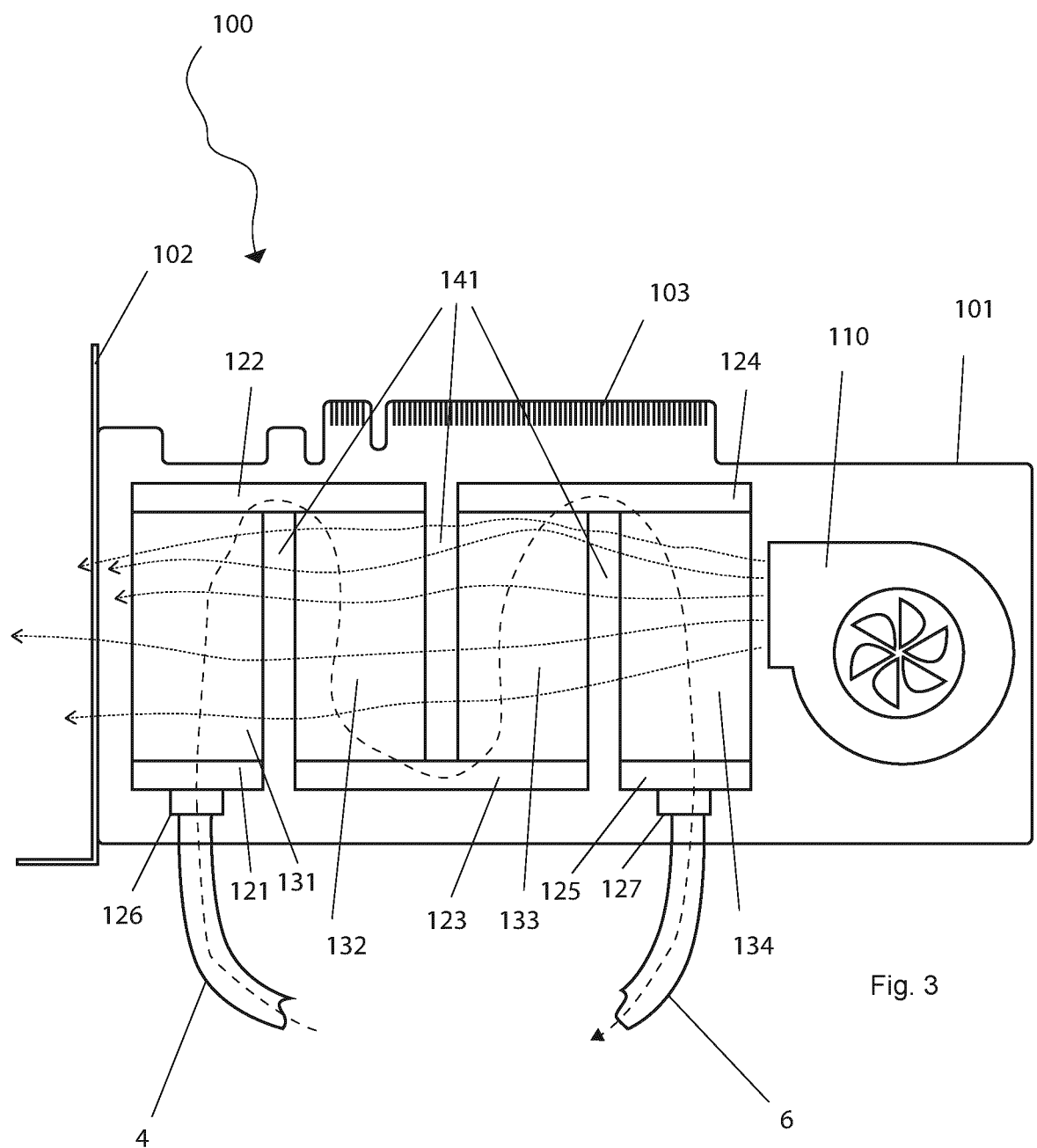

FIG. 3 is a schematic top view of the cooler 100 of the invention showing for example in more detail the inner liquid path. The cooler 100 is mounted on a PCB 101 with PCI-e compliant protrusions 103. The cooling device 103 may draw power for the airflow unit 110 over the PCI-e slot. The cooling device may further draw cooling controls over the PCI-e plug 103. The electrical connections shown on the PCI-e plug are preferred but not required.

The cooling device 100 can be mounted in a PC case using a standard PCI-e bracket 102 at the rear interface. By the cooling device 100 using the PCI-e bracket 102 and the PCI-e interface for attachment in the PC case, the cooling device 100 is conventionally sufficiently affixed in the case, and easy installation is achieved.

Heated cooling liquid from a processing unit enters the cooler 100 from a return tube 4 through the liquid inlet 126. The cooling liquid flows through the radiator unit 130, and then flows out through the outlet fitting 127 and into the cooling tube 6. Not seen on the top view schematic is the structure of the individual radiator bridges 131, 132, 133, 134 or the manifolds 121, 122, 123, 124, 125.

The cooling liquid is spread in a dividing manifold 121 between channels of a first radiator bridge 131. There the heated cooling liquid is actively cooled by air from the airflow unit 110 passing through the first radiator bridge 131. At the opposite side of the first radiator bridge 131, a redistributing manifold 122 distributes the now slightly cooled water to the channels of a second radiator bridge 132. There the water is cooled again. When the water is on the opposite side of the second radiator bridge 135, a second redistributing manifold 123 redistributes the now further cooled water to channels of a third radiator bridge 133. There the water is cooled by air from the airflow unit 110 for the third time. After the water passes over the third radiator bridge 133, it passes into a third redistributing manifold 124 and is redistributed to the channels of a fourth radiator bridge 125. When the water passes over the fourth radiator bridge 125, it is cooled by the airflow unit 110 for the fourth time. The water passes out of the cooling device 100 and into the cooling tube 6 to be moved to a processing unit, such as a GPU, to provide cooling.

The airflow unit 110 is located adjacent to the last radiator bridge being the fourth radiator bridge 134. Ambient air from the airflow unit 110 absorbs the heat of the radiator bridges gradually as it passes through/over them. This ensures that the air from the airflow unit 110 is warmest at the first radiator bridge 131, when the water is also hottest, and that the air is closest to ambient temperature at the fourth radiator bridge 134, when the water is the coolest. When the water passes out of the cooling unit 100, it has potentially, and ideally, achieved a temperature near ambient.

By providing radiator gaps 141, warm water from the radiator bridges are prevented from dissipating heat to the colder 'upstream' radiator bridges and the effective length of the radiator is increased. Furthermore, as each successive bridge is closer to the ambient temperature air of the airflow unit 110, a temperature gradient is maintained and the average temperature difference between the air and the radiator is increased thus improving cooling efficiency. In other words, even though the cooling unit 100 relies on a cross-flow radiator design, it achieves stepwise counterflow heat exchange characteristics useful under the given size and dimensioning constraints.

In FIG. 3, an embodiment is illustrated having side panels being merely the manifolds 121, 122, 123, 124, 125.

Figure 4:
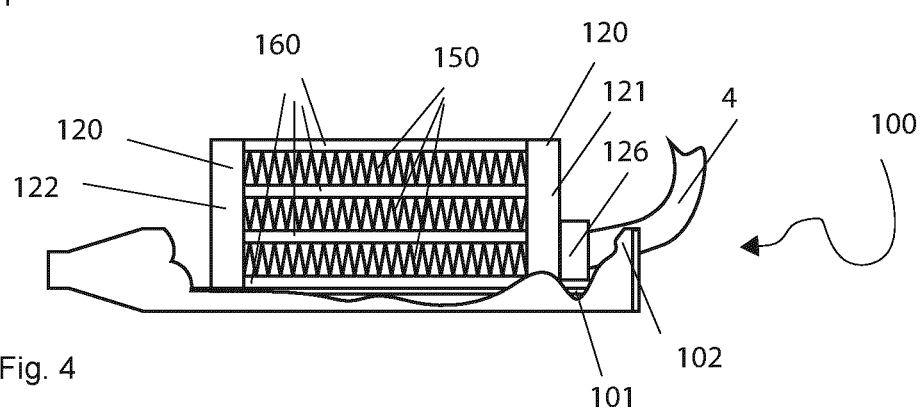

FIG. 4 is a cross-sectional side view of a cooling device 100 according to the invention parallel to the surface of the long side of the PCI-e bracket 102. Channels 160 are part of the radiator bridges and run between the side panels 120. The channels 160 are formed from a thermally conductive material such as aluminium or copper. They allow a fluid connection between manifolds 121, 122 on either side of the radiator bridge. Between the channels 160, fin layers 150 made from a thermally conductive material allow air transport in the first direction being the direction of the airflow provided by the airflow unit, while providing a high surface area for heat dissipation.

Figure 5:
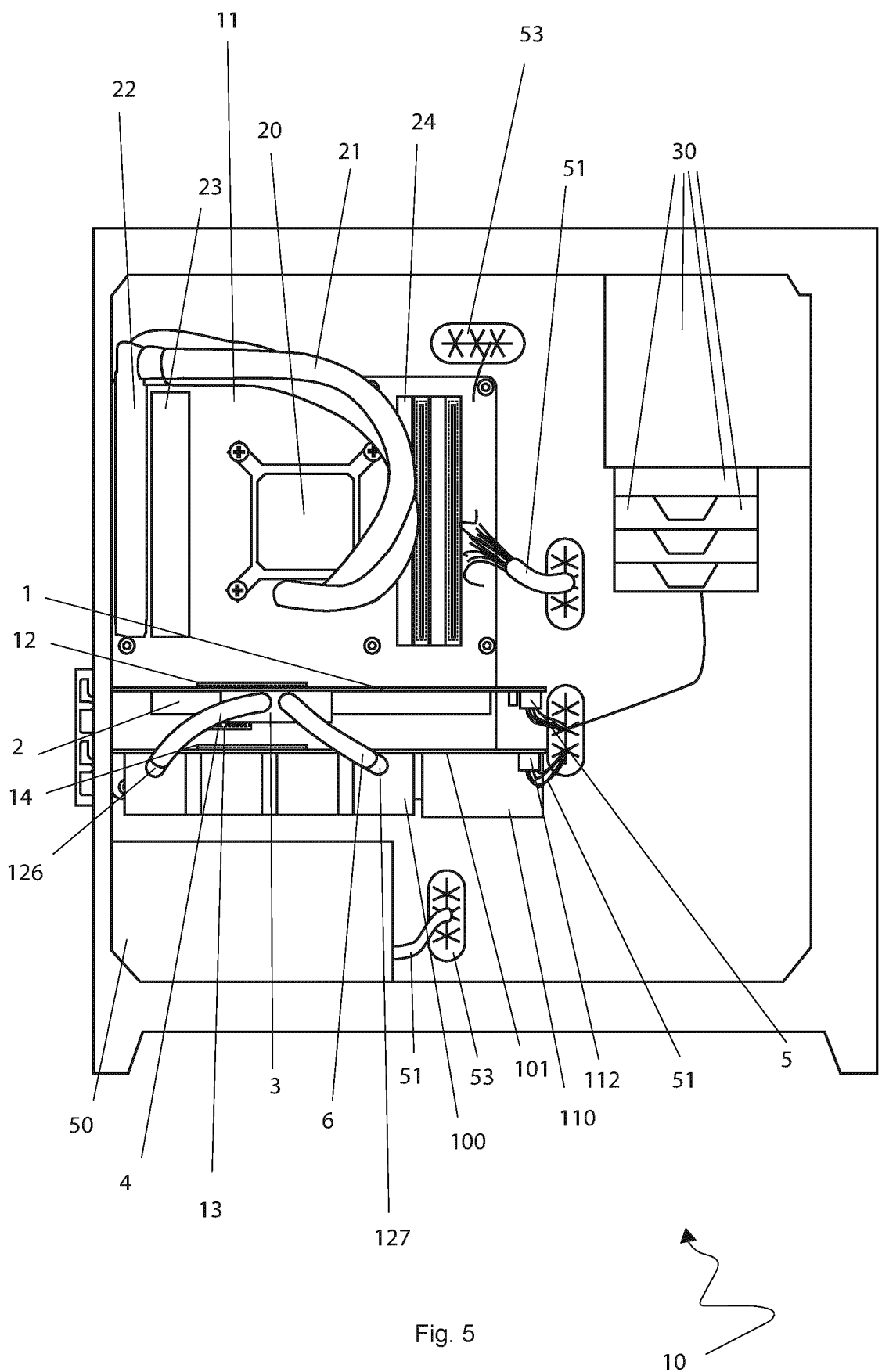

FIG. 5 is a parallel-projected side view of a stationary computer 10 with a cooling device according to the invention. The computer 10 comprises drive trays 30, a power supply unit 50 and a motherboard 11. Further, the PC has electrical wiring 51 and cable routing holes 53 for cable management.

The motherboard 11 has a CPU with a pump 20 for liquid cooling with CPU tubes 21, a CPU radiator and a CPU fan 23. The motherboard have RAM modules 24 installed. The motherboard further has three PCI-e slots 12, 13, 14.

A GPU 1 is mounted in the top PCI-e slot 12. The GPU 1 has a heat sink 2 with a GPU pump 3. Cool water is directed to the heat sink 2, where it absorbs the heat produced by the GPU. The heat sink can be made from any heat-conductive material and is typically made from aluminium, copper or zinc copper. A liquid pump 3 maintains the flow of water and can conveniently be made in one piece with, or attached to, the GPU heat sink 2. The water moves between the GPU 1 and the cooling unit 100 via a cooling tube 6 and a return tube 4.

A cooling unit 100 is mounted in another PCI-e slot 15. In FIG. 4, the cooling unit 100 is mounted in the bottom PCI-e slot 14. Depending on motherboard layout, any desirable PCI-e slot can be used.

The cooling liquid enters the cooling unit 100 by way of a liquid inlet 126 and exits by way of a liquid outlet 127. These can conveniently be modular to allow fitting tubes to extend between the GPU and the cooling unit 100.

The cooling unit 100 has an airflow unit 110 for blowing ambient air over the radiator unit 130 of the cooling unit 100. In the shown embodiment, the airflow unit 110 is powered by a conventional fan power connector 112. In a preferable embodiment, power is supplied through the PCI-e slot 14 into a PCI-e plug of the cooling unit 100.

In the shown embodiment, the airflow unit 110 is controlled by a temperature sensor located in the radiator system of the cooling unit 100 thus allowing precision cooling and easing cable management in the PC case. Cable management is eased because this control wire can thus be omitted—using a temperature sensor local to the cooling unit, the wiring can be routed on the PCB 101 instead.

Figure 6A:
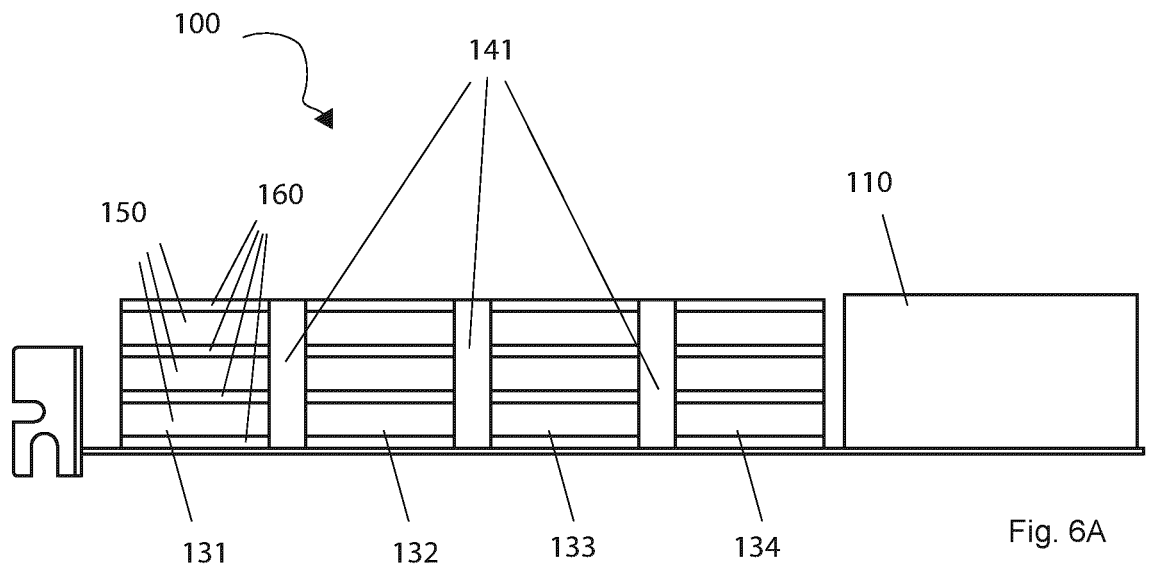
Figure 6B:
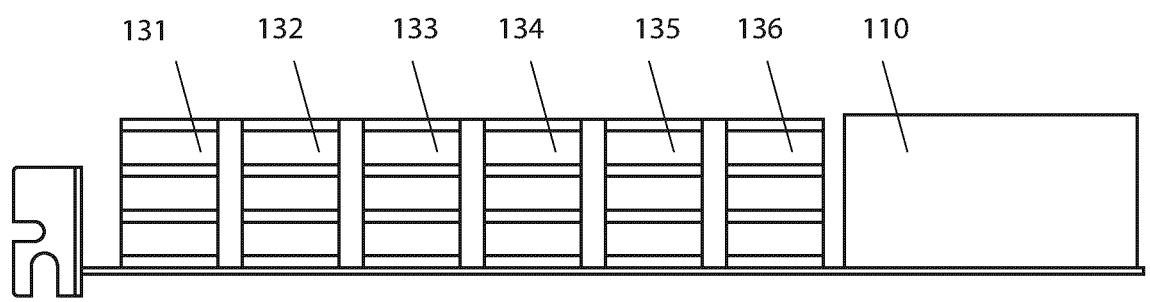
Figure 6C:
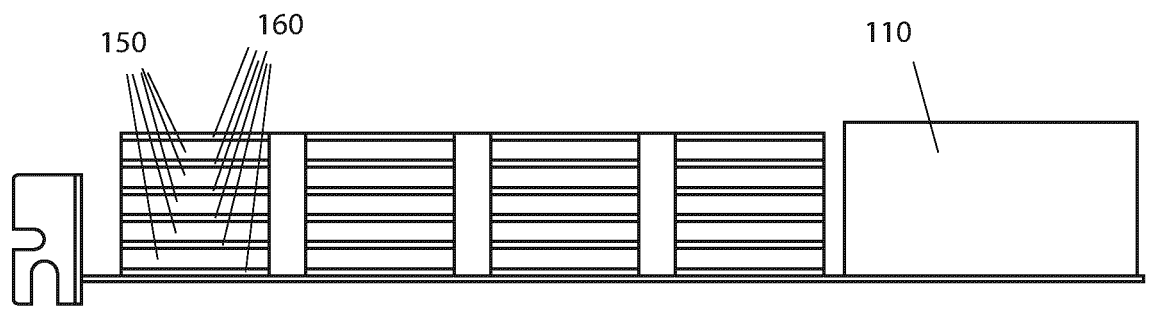

FIGS. 6A-C are cross-sectional front-views of various embodiments of a cooling unit 100 according to the invention. FIG. 6A illustrates the radiator unit 130 of the embodiments hitherto shown and discussed. It has four radiator bridges 131, 132, 133, 134, and each radiator bridge has four channels 160 with three fin-layers sandwiched between them. It further has an airflow unit 110 and three radiator gaps 141.

FIG. 6B illustrates another embodiment of a cooling device 100 according to the invention having six radiator bridges 131, 132, 133, 134, 135, 136. Thereby, effective radiator length is increased which may improve cooling efficiency.

FIG. 6C illustrates a further embodiment of a cooling device 100 according to the invention, where radiator bridges have six channels 160 and five interspersed fin layers 150. Thereby, the surface area of the water is increased per volume passed through the cooling device 100 which may improve cooling efficiency.

Figure 7A:
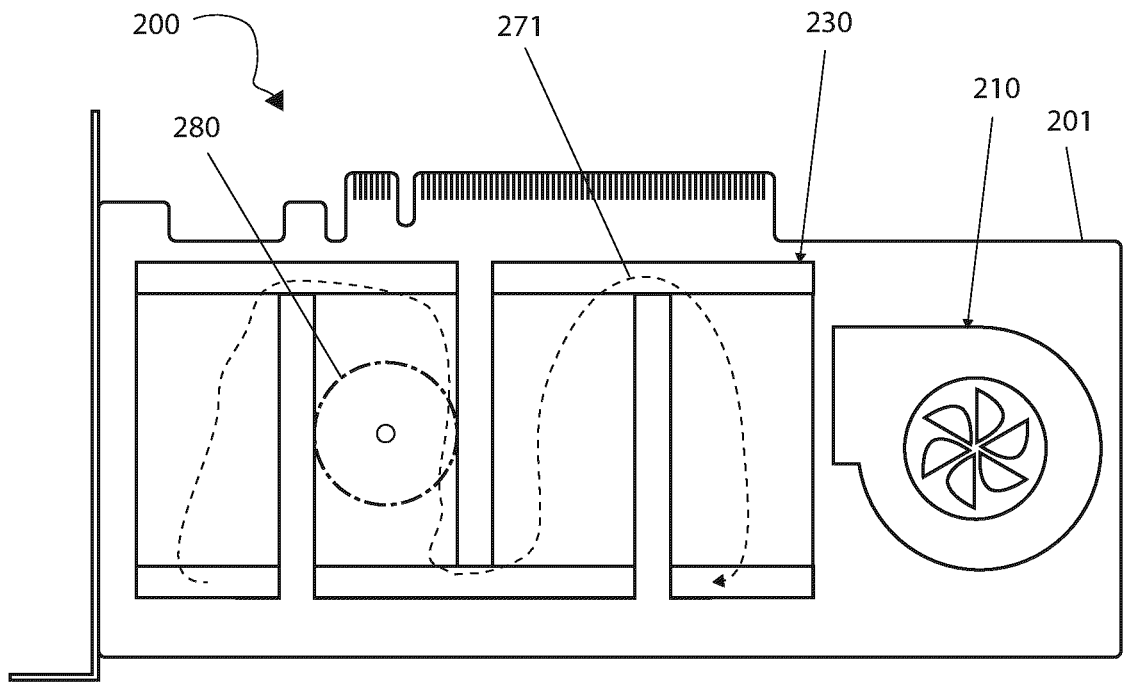
Figure 7B:
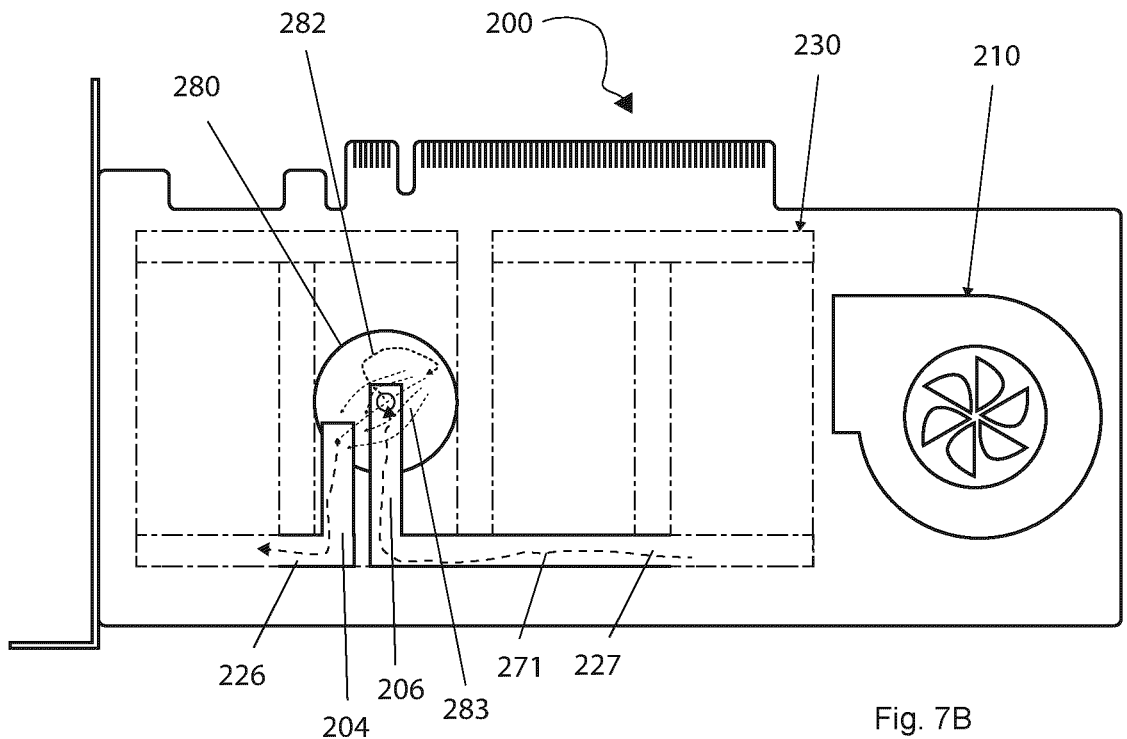

FIGS. 7A and 7B are top views of an embodiment of the invention, where it relates to an integrated computing system 200. The integrated computing system 200 comprises a computing card, such as an extension card. The computing card has heat-producing electronical components and units built into the computing card PCB 201. FIGS. 7A and 7B show two different parts of a liquid loop 271. The liquid loop 271 corresponds to the inner liquid path of the radiator unit 230 hitherto described, with additional features to create a complete liquid loop.

In FIG. 7A, the part of the liquid loop 271, which matches the inner liquid path described so far, is shown. The liquid loop 271 passes through the radiator unit 230 along the serpentine path as described so far for the inner liquid path. A dashed circle indicates the location of a liquid pump 280 which sits atop a cold plate chamber (better illustrated in FIGS. 8A and 8B).

Looking now at FIG. 7B, it is seen that from the radiator unit 230, the liquid loop 271 conducts cooling liquid through an outlet 227 via a liquid cooling channel 206 to a pump chamber 281 of a liquid pump 280 which pump drives the cooling liquid flow. From the pump chamber 281, the cooling liquid is moved into a cold plate chamber 283 beneath the liquid pump 280. In the cold plate chamber 283, the cooling liquid absorbs heat from electronical components of the computing card/expansion card PCB 201, and is then conducted further on via a return channel 204 to a liquid inlet 226, and then back to the radiator unit 230 farthest from the airflow unit 210 to again move towards the airflow unit 210 along the liquid path of the radiator unit 230 as seen in FIG. 7A. In the radiator unit, the cooling liquid then dissipates the heat to the airflow produced by the airflow unit 210.

This structure allows the liquid-to-air heat exchange performed by the radiator unit 230 to be of the counter-flow type, thus being very efficient while being user friendly for being an integrated, compact, pre-programmed unit.

Figure 7C:
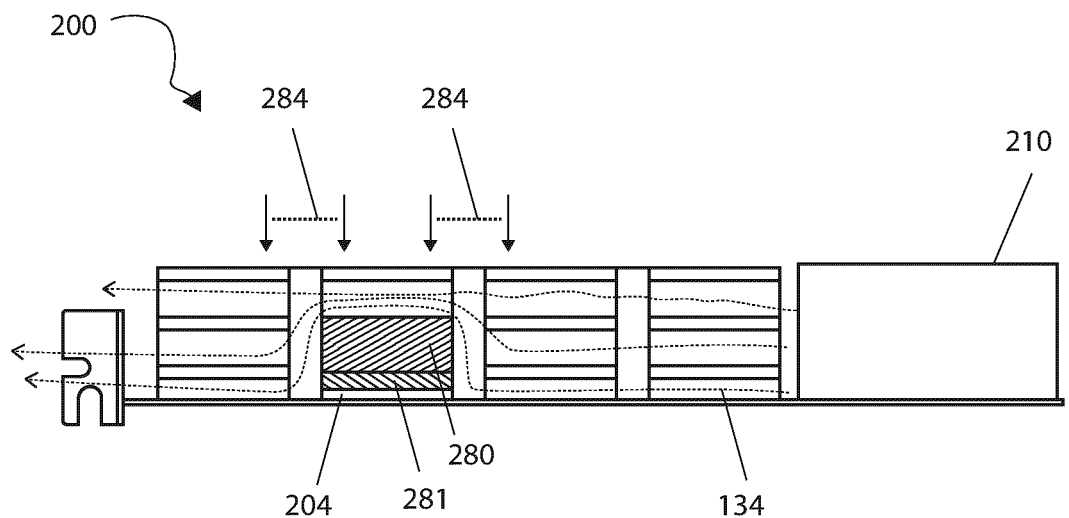

FIG. 7C is a side view through-cut of the integrated computing system 200 also shown in FIGS. 7A and 7B. It has a cooling unit, as described in FIGS. 1-6, built integrally with an integrated computing system 200. In this embodiment, a computing card, such as an extension card, has heat-producing electrical components 204. This is typically a GPU processor, but may also be RAM, converters and/or other such components. The cooling unit is mounted directly on top of this computing card/extension card PCB 201. The radiator unit 230 and the airflow unit 210 are attached securely onto the computing card PCB 201.

A cold plate 281 is attached to at least one electronical component 204 and allows a liquid to pass over the cold plate 281 to move heat away. A liquid pump 280 moves the liquid from the cold plate 281 to the radiator unit 230 which is as hitherto described except as will be made clear in the following. The liquid pump 280 is attached to the cold plate 281 which allows a compact integrated computing system 200. The liquid is conducted from the cold plate 281 by the pump 280 to the radiator unit 230 by first entering the radiator unit 230 at the end distal to the airflow unit 210, then moving along a serpentine inner liquid path towards the airflow unit 210. After the cooling liquid has passed through the radiator unit 230, it passes back to the liquid pump 280 and the cold plate 281 to draw heat away from the electronical component(s) 204.

At a point along the serpentine path, at least one radiator bridge is modified or foregone entirely to allow placement of the liquid pump 280 and/or cold plate 281 inside the boundary of the radiator unit 230. Such a liquid pump 230 placement allows utilisation of the maximal amount of space for heat exchange possible within the physical footprint of a expansion card slot, or any number of slots, such as two, three, or four such slots. There may be formed liquid- and airflow constriction around the liquid pump 280, where liquid flow and airflow increases. In other words, where a radiator bridge has fewer channels than other places, this creates a constriction, while fewer fin layers between channels of the radiator bridge form an airflow constriction. To improve thermal efficiency, a shroud 284 may be placed over the affected radiator bridges, such as the radiator bridge comprising the pump and its neighbouring bridges. This retains the airflow inside the radiator unit 230 which in turn increases thermal efficiency of radiator bridges located airflow-wise downstream of the liquid pump. Obviously, such a shroud 284 may cover the entire radiator length or cooling unit length. Advantageously, the shroud 284 could be made from a thermal insulator, such as a polymer, or a very thin strip of metal foil.

A thin strip of perforated plastic/polymer or metal foil may be used as well to cool the shroud 284 and avoid thermal communication between bridges.

In another embodiment, the pump 280 is placed next to the airflow unit 210 instead of inside the radiator unit 230.

Figure 8:
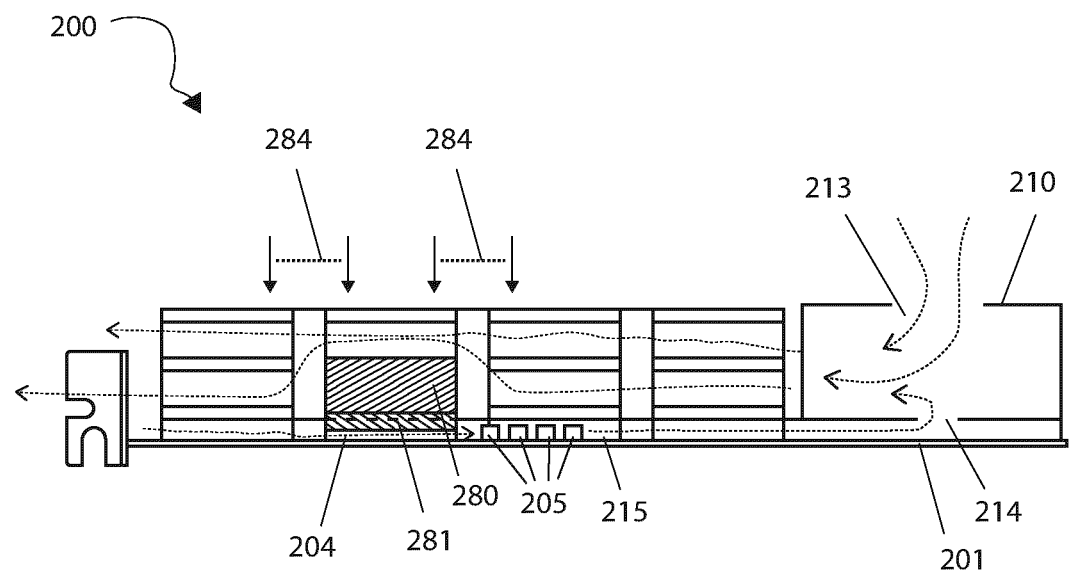

FIG. 8 illustrates an embodiment of a computing system 200 according to the invention. In the shown embodiment, the airflow unit 210 is preferably a radial fan. The airflow unit 210 has an upper airflow inlet 213 and further a lower airflow inlet 214. Using an upper airflow inlet 213 allows a high air intake. The lower airflow inlet 214 is connected to an airflow inlet channel 215 extending along the extension card PCB 201 and passes by at least one heat-producing electronical unit 205. In this way, the inlet air may serve to cool some electrical components. In addition to a number of heat-generating electrical components 204, an extension card PCB 201 may have several moderately heat-producing electronical units 205 producing a range of different degrees of heat, either less than a central chip or placed away from such a central electrical component 204. It may thus be advantageous to cool at least some of these electronical units 205 with airflow. By dimensioning the lower airflow inlet 214 and the airflow inlet channel 215 in accordance with the thermal profile of an extension card PCB 201, it is possible to achieve granular and efficient card cooling.

The invention claimed is:

1. A cooling unit for cooling liquid in a liquid-cooled computer system, the cooling unit comprising:
   an airflow unit configured to generate an airflow in a first direction along an airflow path;
   a radiator unit comprising:
      a liquid inlet configured to receive an inflow of a cooling liquid;
      a liquid outlet configured to release an outflow of the cooling liquid;
      an inner liquid path configured to conduct the cooling liquid between the liquid inlet and the liquid outlet; and
      an array of at least two radiator bridges, each comprising a plurality of parallel channels, the at least two radiator bridges traversing the airflow path and being spaced apart along the first direction, the at least two radiator bridges further being thermally separated from one another by gaps;
   wherein a first radiator bridge of the at least two radiator bridges is configured to receive the cooling liquid from the liquid inlet to pass through its plurality of parallel channels, the first radiator bridge being the radiator bridge that is the farthest from the airflow unit;
   wherein the inner liquid path is configured to conduct the cooling liquid from the liquid inlet, sequentially via the at least two radiator bridges by order of proximity to the first radiator bridge, to the liquid outlet; and
   whereby the airflow generated by the airflow unit passes through the at least two radiator bridges to exchange heat between the airflow and the radiator unit.

2. The cooling unit according to claim 1, wherein
   the plurality of parallel channels are spaced from one another along a height dimension;
   the radiator unit has a length extending in the first direction; and
   the radiator unit has a length being greater than its height.

3. The cooling unit according to claim 1, wherein the radiator unit comprises four or more radiator bridges.

4. The cooling unit according to claim 1, wherein the radiator unit comprises an even number of radiator bridges.

5. The cooling unit according to claim 1, wherein the plurality of parallel channels of the at least two radiator bridges are substantially flat with oblong cross-sections.

6. The cooling unit according to claim 1, wherein two neighboring radiator bridges are connected to provide the inner liquid path through one or more manifolds configured to combine and redistribute the cooling liquid among the plurality of channels of the two neighboring radiator bridges.

7. The cooling unit according to claim 1, further comprising an expansion card plug configured to fit frictionally into a corresponding expansion slot on a motherboard or logic board of the liquid-cooled computer system.

8. The cooling unit according to claim 7, wherein the expansion card plug is configured to electrically connect the cooling unit and the motherboard or logic board.

9. The cooling unit according to claim 1, wherein the cooling unit is configured to fit into a server cabinet rack system and take up one or more rack slots in a server cabinet to provide cooling for a plurality of computing units.

10. The cooling unit according to claim 1, further comprising a temperature sensor configured to measure the temperature of the cooling liquid in the inner liquid path, wherein the cooling unit is configured to control the speed of the airflow unit based on sensor data from the temperature sensor.

11. A liquid cooling system for a processing unit, the liquid cooling system comprising:
- a cooling unit comprising:
  - an airflow unit configured to generate an airflow in a first direction along an airflow path;
  - a radiator unit comprising
    - a liquid inlet configured to receive an inflow of a cooling liquid;
    - a liquid outlet configured to release an outflow of the cooling liquid;
    - an inner liquid path configured to conduct the cooling liquid between the liquid inlet and the liquid outlet; and
    - an array of at least two radiator bridges, each comprising a plurality of parallel channels, the at least two radiator bridges traversing the airflow path and being spaced apart along the first direction, the at least two radiator bridges further being thermally separated from one another by gaps;
  - wherein a first radiator bridge of the at least two radiator bridges is configured to receive the cooling liquid from the liquid inlet to pass through its plurality of parallel channels, the first radiator bridge being the radiator bridge that is the farthest from the airflow unit;
  - wherein the inner liquid path is configured to conduct the cooling liquid from the liquid inlet, sequentially via the at least two radiator bridges by order of proximity to the first radiator bridge, to the liquid outlet; and
  - whereby the airflow generated by the airflow unit passes through the at least two radiator bridges to exchange heat between the airflow and the radiator unit;
- a heat sink attached to the processing unit, the heat sink having a heat sink liquid inlet, a heat sink liquid outlet, and a heat sink liquid path configured to conduct the cooling liquid between the heat sink inlet and the heat sink outlet for heat exchange;
- a cooling tube extending from the liquid outlet to the heat sink inlet;
- a return tube extending from the heat sink outlet to the liquid inlet; and
- a pump configured to pump the cooling liquid through the liquid cooling system to move the cooling liquid from the liquid inlet, sequentially via the at least two radiator bridges by order of proximity to the first radiator bridge, to the liquid outlet.

12. The liquid cooling system according to claim 11, wherein the cooling liquid substantially fills the inner liquid path, the cooling and return tubes, and the heat sink liquid path.

13. The liquid cooling system according to claim 11, wherein two neighboring radiator bridges are connected to provide the inner liquid path through one or more manifolds configured to combine and redistribute the cooling liquid among the plurality of channels of the two neighboring radiator bridges.

14. The liquid cooling system according to claim 11, wherein the cooling unit further comprises a temperature sensor configured to measure the temperature of the cooling liquid in the inner liquid path, wherein the cooling unit is configured to control the speed of the airflow unit based on sensor data from the temperature sensor.

15. An integrated computing system comprising:
- a cooling unit comprising:
  - an airflow unit configured to generate an airflow in a first direction along an airflow path;
  - a radiator unit comprising
    - a liquid inlet configured to receive an inflow of a cooling liquid;
    - a liquid outlet configured to release an outflow of the cooling liquid;
    - an inner liquid path configured to conduct the cooling liquid between the liquid inlet and the liquid outlet; and
    - an array of at least two radiator bridges, each comprising a plurality of parallel channels, the at least two radiator bridges traversing the airflow path and being spaced apart along the first direction, the at least two radiator bridges further being thermally separated from one another by gaps;
  - wherein a first radiator bridge of the at least two radiator bridges is configured to receive the cooling liquid from the liquid inlet to pass through its plurality of parallel channels, the first radiator bridge being the radiator bridge that is the farthest from the airflow unit;
  - wherein the inner liquid path is configured to conduct the cooling liquid from the liquid inlet, sequentially via the at least two radiator bridges by order of proximity to the first radiator bridge, to the liquid outlet; and
  - whereby the airflow generated by the airflow unit passes through the at least two radiator bridges to exchange heat between the airflow and the radiator unit;
- an expansion card comprising an expansion card PCB and a processing component;
- a cold plate attached to the processing component with a cold plate chamber, wherein the cooling liquid is conducted through the cold plate chamber to effect heat exchange between the processing component and the cooling liquid;
- a cooling channel extending from the liquid outlet to the cold plate chamber and a return channel extending from the cold plate chamber to the liquid inlet, wherein the cooling and return channels,
- the liquid inlet and liquid outlet, the cold plate chamber, and the inner liquid path form a liquid loop; and
- a liquid pump interposed in the liquid loop and configured to pump the cooling liquid through the liquid loop;
- wherein the cooling unit is mounted onto the expansion card PCB.

16. The integrated computing system according to claim 15, where the liquid pump is configured to move the cooling liquid in a direction from the liquid inlet to the first radiator bridge, then sequentially via the radiator bridges by order of proximity to the first radiator bridge, to the liquid outlet.

17. The integrated computing system according to claim 15, wherein the airflow unit comprises a radial fan.

18. The integrated computing system according to claim 15, wherein the airflow unit comprises an upper airflow inlet and a lower airflow inlet, wherein at least one of the airflow inlets is configured to receive air from an airflow inlet channel adjacent to the expansion card PCB, the airflow inlet channel being configured to provide air cooling of one or more heat-producing electronic units on the expansion card PCB.

19. The integrated computing system according to claim 15, wherein two neighboring radiator bridges are connected to provide the inner liquid path through one or more manifolds configured to combine and redistribute the cooling liquid among the plurality of channels of the two neighboring radiator bridges.

20. The integrated computing system according to claim 15, the cooling unit further comprises a temperature sensor configured to measure the temperature of the cooling liquid in the inner liquid path, wherein the cooling unit is configured to control the speed of the airflow unit based on sensor data from the temperature sensor.

* * * * *